(12) United States Patent
Uhlig et al.

(10) Patent No.: US 7,833,612 B2
(45) Date of Patent: Nov. 16, 2010

(54) SUBSTRATE FOR INKJET PRINTING AND METHOD OF MANUFACTURING THE SAME

(75) Inventors: Albrecht Uhlig, Berlin (DE); Michael Redecker, Berlin (DE); Marcus Schaedig, Berlin (DE); Thomas Schrader, Berlin (DE); Werner Humbs, Berlin (DE)

(73) Assignee: Samsung Mobile Display Co., Ltd., Yongin (KR)

( * ) Notice: Subject to any disclaimer, the term of this patent is extended or adjusted under 35 U.S.C. 154(b) by 1500 days.

(21) Appl. No.: 10/936,708

(22) Filed: Sep. 9, 2004

(65) Prior Publication Data

US 2005/0058785 A1    Mar. 17, 2005

(30) Foreign Application Priority Data

Sep. 12, 2003   (DE)   ................. 103 43 351
Jan. 6, 2004    (KR)   .......... 10-2004-0000521

(51) Int. Cl.
  *B32B 7/14*   (2006.01)
  *B32B 7/02*   (2006.01)
  *G09G 3/30*   (2006.01)

(52) U.S. Cl. ................ 428/201; 428/212; 428/917; 345/76

(58) Field of Classification Search .............. 428/304.4, 428/308.4, 690, 917, 195.1, 201, 212; 257/40, 257/89; 313/504, 506; 345/76
See application file for complete search history.

(56) References Cited

U.S. PATENT DOCUMENTS

| | | | |
|---|---|---|---|
| 4,539,507 A | | 9/1985 | VanSlyke et al. |
| 4,885,211 A | | 12/1989 | Tang et al. |
| 5,017,459 A | * | 5/1991 | McColgin ............... 430/299 |
| 6,309,789 B1 | | 10/2001 | Takano et al. |
| 6,388,377 B1 | | 5/2002 | Kobayashi et al. |
| 6,476,988 B1 | * | 11/2002 | Yudasaka ............... 359/885 |
| 6,980,272 B1 | * | 12/2005 | Matthies ............... 349/139 |
| 7,122,482 B2 | * | 10/2006 | Xu et al. ............... 438/738 |
| 2002/0086180 A1 | * | 7/2002 | Seo et al. ............... 428/690 |

FOREIGN PATENT DOCUMENTS

| | | |
|---|---|---|
| DE | 3702839 | 8/1987 |
| DE | 10236404 | 2/2004 |

(Continued)

OTHER PUBLICATIONS

"Surface Energy (Surface Wetting Capability)"; NDT Resource Center; taken from http://www.ndt-ed.org/EducationResources/CommunityCollege/PenetrantTest/PTMaterials/surfaceenergy.htm;☐☐Imported as surface energy.pdf.*

(Continued)

*Primary Examiner*—Mark Ruthkosky
*Assistant Examiner*—Gerard T Higgins
(74) *Attorney, Agent, or Firm*—H.C. Park & Associates, PLC (57) ABSTRACT

A substrate for inkjet printing, which includes a photoresist layer structure on a base substrate, and a method of manufacturing the same are provided. The substrate, which has high surface tension variation and slight thickness variation, may be manufactured at a low cost. The substrate includes a discontinuous organic layer structure made of a fluorinated hydrocarbon or a polysiloxane on the photoresist layer structure.

16 Claims, 7 Drawing Sheets

FOREIGN PATENT DOCUMENTS

| | | | |
|---|---|---|---|
| EP | 0989778 | | 3/2000 |
| EP | 0996314 | A1 | 4/2000 |
| EP | 1122560 | | 8/2001 |
| EP | 1160590 | | 12/2001 |
| JP | 05-241012 | | 9/1993 |
| JP | 09203803 | | 8/1997 |
| JP | 09230129 | | 9/1997 |
| JP | 2000-323276 | | 11/2000 |
| JP | 2002-334782 | | 11/2002 |
| JP | 2003-077652 | | 3/2003 |
| KR | 2001-0012686 | | 2/2001 |
| WO | WO 9948338 | A1 * | 9/1999 |

OTHER PUBLICATIONS

Herausgeber, Prof. Dr. Jurgen Falbe, et al., "Dunne Schichten," Rompp Chemie Lexikon, Bearbeitet von zahlreichen Fachkollegen Zentralredaktion: Dr. Elisabeth Hillen, Georg Thieme Verlag Stuttgart, New York, Aug. 1995, p. 1051 (with English Translation—Thin Layers).

Herausgeber, Prof. Dr. Jurgen Falbe, et al., "Gasphasenabscheldung," Rompp Chemie Lexikon, Bearbeitet von zahlreichen Fachkollegen Zentralredaktion: Dr. Elisabeth Hillen, Georg Thieme Verlag Stuttgart, New York, Aug. 1995, p. 1494 (with English Translation—Gas Phase Deposition).

* cited by examiner

SUBSTRATE FOR INKJET PRINTING AND METHOD OF MANUFACTURING THE SAME

This application claims the benefit of German Patent Application No. 103 43 351.1, filed on Sep. 12, 2003, and Korean Patent Application No. 2004-521, filed on Jan. 6, 2004, which are hereby incorporated by reference for all purposes as if fully set forth herein.

BACKGROUND OF THE INVENTION

1. Field of the Invention

The present invention relates to a substrate for inkjet printing and a method of manufacturing the same.

2. Discussion of the Related Art

Inkjet printing is one of most significant structuring processes used to produce full-color displays that use light-emitting, semi-conducting polymers (LEPs). The process entails depositing small drops of a solution of the corresponding polymer onto a suitable substrate. The inkjet printing process, however, may also be used to deposit a color filter or a DNA sensor onto a substrate.

These applications require exact placement of a target substance, such as ink, on an activated surface of the substrate. The inkjet printing technique fits this requirement. The ink is prepared by dissolving an active substance in an auxiliary substance, and then depositing the ink onto the substrate as small droplets using a piezo or "bubble jet" inkjet technique. Exact positioning of ink droplets onto the substrate may be achieved by several techniques, including accurately positioning the inkjet head relative to the substrate. A film of the active substance is formed on the substrate as the auxiliary substance evaporates.

A common failure occurring in the printing process is the run-out of ink droplets of the active substance toward neighboring positions on the surface of the substrate. In a display using organic light-emitting diodes (OLED), in which red, green, and blue emitting areas are closely arranged, such a run-out of ink droplets mixes the three colors of the light emitting materials in the emitting areas.

OLED display devices have been known for over 20 years. They are classified into large molecular weight polymer-based OLEDs (PLEDs) and low molecular weight OLEDs (SM-OLEDs). WO00/76008A1 (CDT) describes a basic structure of a PLED display device. U.S. Pat. Nos. 4,539,507 and 4,885,211 (Eastman-Kodak) describe the principle structure of an SM-OLED in which $ALQ_3$ (tris-(5-chloro-8-hydroxy-quinolinato)-aluminum) is used as a light-emitting and electron transport material.

OLED display devices are electroluminescent display devices. In such a device, electrons and holes are injected into a semi-conducting material layer through appropriate contacts, and light is generated by the recombination of the charge carriers.

A piezo inkjet printing technique is typically used to manufacture full-color displays based on polymer OLEDs. In this case, small drops of a solution containing an active substance (hole transfer or light-emitting materials) are deposited on the active surface of a suitable substrate. The active surface (single picture point) for high-resolution displays recently used in mobile phones has dimensions of approximately 40 µm×180 µm.

Conventional inkjet heads produce ink droplets having a diameter of 30 µm. Consequently, ink droplet diameter lies within the dimension of the picture point. In order to prevent an overflow of the ink droplets, the substrate surface may be formed using one of the following methods.

In a first method, a substrate surface is produced so that areas have different surface tensions (energies) providing different covering characteristics to ink applied thereto. A second method uses a geometrical (mechanical) barrier for preventing ink droplet overflow.

One approach is disclosed in EP 0989778 A1 (Seiko-Epson). A material that may induce different surface tensions over the substrate surface is utilized. Printed ink may run in areas with high surface energies because areas with low surface energies act as barriers. OLEDs with a higher surface energy peripheral zone are normally designed in order to obtain a uniform thickness film. The film is homogeneous to the peripheral zone, but it may be much thinner near an outer region of the active zone toward the barrier. Required differences in surface energy can be achieved in many ways.

EP 0989778 A1 (Seiko Epson) describes a two-layered surface structure in which an upper layer has a smaller surface tension, and a lower layer has a larger surface tension. The varying surface tensions may be achieved by a surface treatment using plasma. The lower layer is typically made of inorganic materials such as silicon oxide/nitride.

In this case, the inorganic layer corresponds to the peripheral zone with a larger surface tension, thereby making it easier to deposit a homogeneous polymer film in an inkjet printing process.

Such layers may be deposited and patterned using general semiconductor manufacturing processes, such as sputtering, plasma enhanced chemical vapor deposition (PECVD), etc. These vaporizing processes require long pulse duration and are costly, which offsets a cost advantage gained by using the OLED technology. The second layer has a specific topology including, for example, separators protruding from the surface of the substrate by a predetermined height and having lower surface tensions. Therefore, a polymeric film deposited on the second layer may have an undesirable increase in thickness from the separators toward the peripheral zone, which may reach pixels.

Another disadvantage of EP 0989778 lies with an ink reservoir used for overflow protection. It is time-consuming and more complicated to construct an ink reservoir because additional processes are involved.

JP09203803 discloses a chemical treatment of a substrate surface that is previously treated with photoresist. The photoresist is exposed through a mask and developed. In this structure, the photoresist is applied to an area having a smaller surface tension than the area to which no photoresist is applied. The photoresist structure has an average surface tension on an edge region so that there is no abrupt change in the surface tension of the substrate. However, the surface tension and geometry in this edge region may not be freely, selectively varied, and it has a low spatial dissolution capacity. Also, only one particular photoresist may be used. Surface tension variations, therefore, may not be induced using other materials, which limits applicability. Finally, the chemical treatment considerably increases the overall manufacturing time.

JP09230129 discloses a two-stage surface treatment method including providing the entire substrate surface with a low surface tension and selectively exposing a region of the surface to a short-wavelength of light to increase the exposed region's surface tension. However, this method may lead to limited surface tension variations, and the time-consuming exposure process may not be suitable for mass production.

As described above, geometrical (mechanical) barriers may be formed to prevent an ink droplet overflow. U.S. Pat. No. 6,388,377 B1 discloses a photoresist stripe structure positioned between two neighboring picture points. Each photoresist stripe is more than 2 μm high and serves as a physical barrier to prevent ink droplet overflow. The production of such photo-resist structures is described in EP 0996314 A1. Two photoresist structures (called "banks"), arranged in parallel to one another, form a channel, and picture points emitting red, green, or blue light are interposed therebetween. A picture points layer is formed by printing a suitable ink in the channel, and the photoresist structures prevent ink droplet overflow toward picture points, which lie on outer sides of the channel. The banks have a height that is larger than 0.5×(the width of a picture point/the diameter of an ink droplet), which is larger than the thickness of an active material film deposited using an inkjet printing technique. Finely structured banks may be manufactured by forming round, oval or triangular notch indentations that serve as overflow preventing reservoirs. However, banks at this height may negatively impact a subsequent metal deposition process. The cathode of an OLED structural element may be formed of metal using thermal evaporation or sputtering. A discontinuous metal film or a metal film that is thinner on the side walls of the "banks" may be deposited due to the shape and height of the photoresist structure, thereby increasing electrical resistance, which requires more input power.

SUMMARY OF THE INVENTION

The present invention provides a substrate with large surface tension variations and small thickness variations that may be manufactured at lower costs than conventional substrates.

The present invention also provides a substrate with a surface that is constructed using only an organic material.

Additional features of the invention will be set forth in the description which follows, and in part will be apparent from the description, or may be learned by practice of the invention.

The present invention discloses a substrate for inkjet printing comprising a base substrate, a discontinuous photoresist layer structure formed on a surface of the base substrate, and a discontinuous organic layer structure formed on a portion of the photoresist layer structure. The discontinuous organic layer structure has a lower surface tension than the discontinuous photoresist layer structure.

The present invention also discloses a substrate for inkjet printing, comprising a base substrate, an intermediate layer made of indium tin oxide and formed on the base substrate, a discontinuous photoresist layer structure formed on a portion of the base substrate and a portion of the intermediate layer, and a discontinuous organic layer structure formed on a portion of the photoresist layer structure. The discontinuous photoresist layer structure has a surface tension ranging from about 50 mN/m to about 100 mN/m. The discontinuous organic layer structure has a surface tension ranging from about 10 mN/m to about 40 mN/m. The intermediate layer has a surface tension ranging from about 50 mN/m to about 100 mN/m.

The present invention also discloses an electroluminescence display device comprising a base substrate, a discontinuous photoresist layer structure formed on a surface of the base substrate, and a discontinuous organic layer structure formed on a portion of the photoresist layer structure. The discontinuous organic layer structure has a lower surface tension than the discontinuous photoresist layer structure.

The present invention also discloses a method of manufacturing a substrate for inkjet printing comprising forming a first discontinuous photoresist layer structure on a surface of a base substrate and forming a discontinuous organic layer structure on at least a portion of the first discontinuous photoresist layer structure.

The present invention also discloses a method of manufacturing a substrate for inkjet printing, comprising forming a first discontinuous photoresist layer structure on a surface of a base substrate, and forming a discontinuous organic layer structure on at least a portion of the first discontinuous photoresist layer structure using a shadow mask. The discontinuous organic layer structure is formed by using chemical vapor deposition or thermal deposition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1:
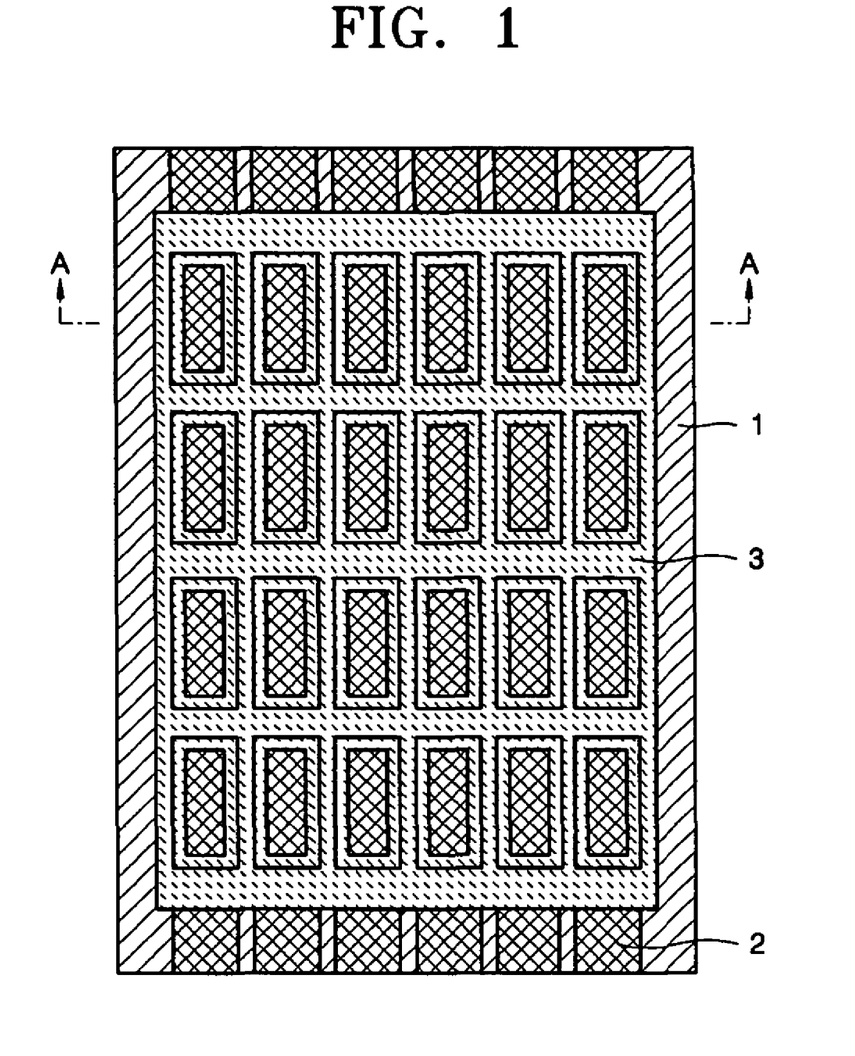
FIG. 1 is a plan view of a base substrate according to an exemplary embodiment of the present invention including an indium tin oxide (ITO) layer structure and a photoresist layer structure.
Figure 2:
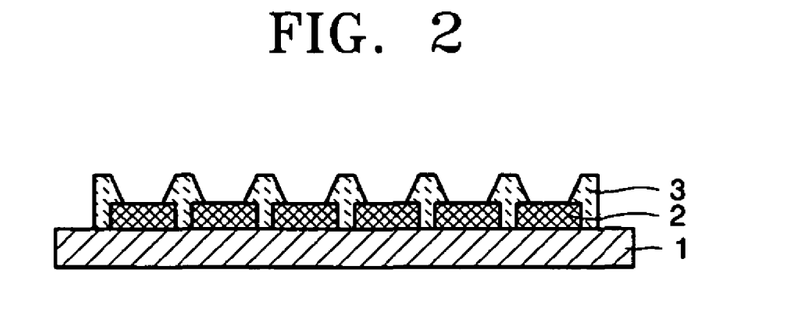
FIG. 2 is a cross-sectional view of the base substrate taken along line A-A of FIG. 1.
Figure 9:
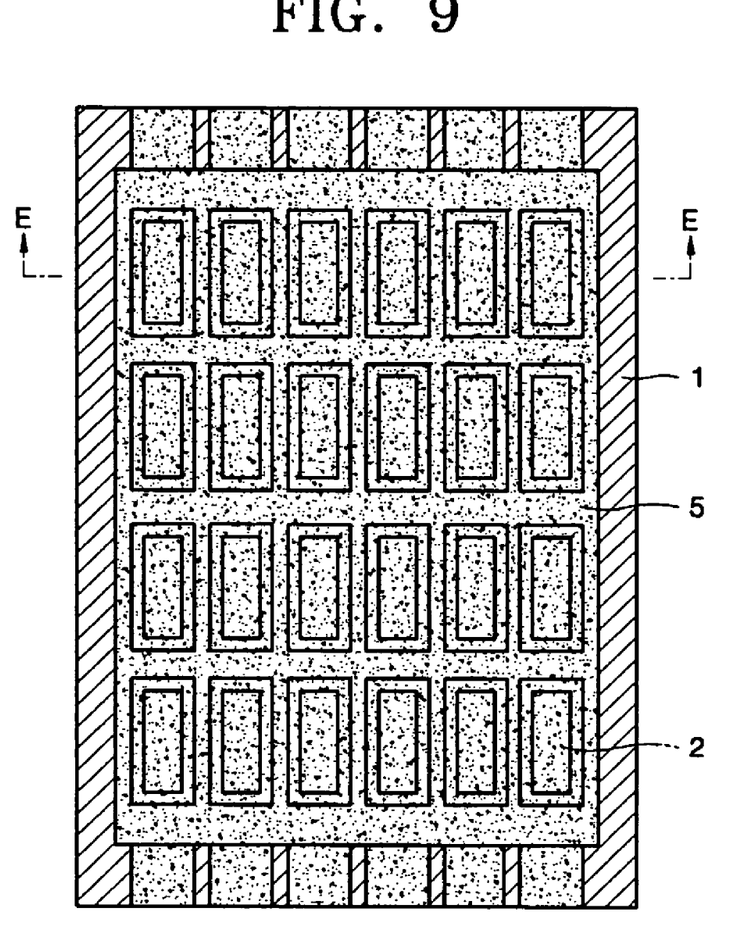
FIG. 9 is a plan view of the substrate of FIG. 7 and on which a Teflon layer is further deposited.
Figure 10:
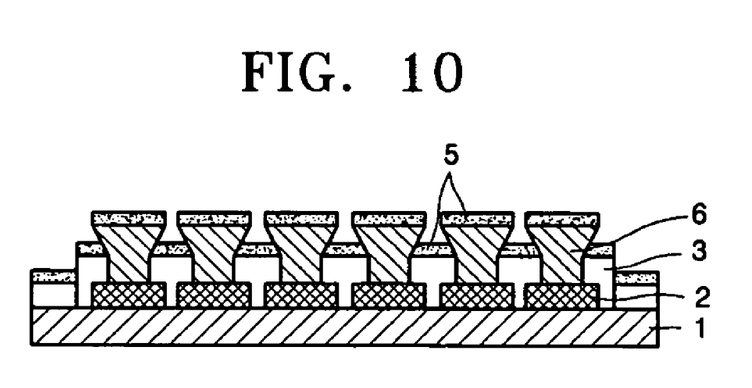
FIG. 10 is a cross-sectional view of the substrate taken along line E-E of FIG. 9.
Figure 12:
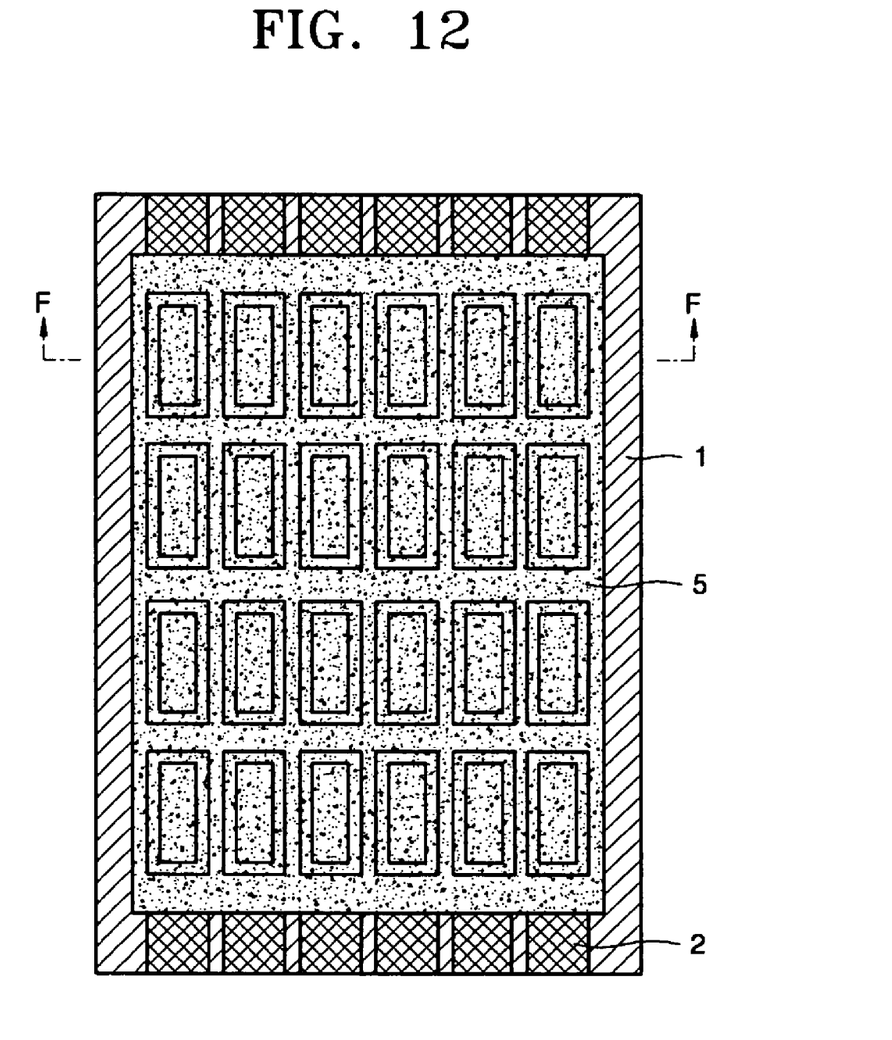
FIG. 12 is a plan view of a substrate further including a continuous polytetrafluoroethylene (TEFLON®) layer in comparison with the substrate of FIG. 1.

Referring to FIG. 1, which is a plan view of a 1.1-mm thick base substrate 1 formed of borosilicate glass, an intermediate layer structure 2 made of a material suitable for hole injection is on a surface of the base substrate 1. The intermediate layer structure 2 may be 100 nm thick and formed of indium-tin-oxide (ITO) or other like substances. The ITO layer structure 2 is patterned as 70 μm wide parallel stripes, spaced 10 μm apart from each other. The terms "layer structure", "ITO layer structure", and "photoresist layer structure" used throughout the specification refer to discontinuous layer patterns defined using a shadow mask by means of laser ablation, or other similar methods. A 0.3 µm thick photoresist layer structure 3 is formed on the base substrate 1. The photoresist layer structure 3 may be made of a photosensitive organic material, such as photoresist JSR PC 302®, using a standard technique such as lacquer coating, and it may be formed using standard techniques such as exposure and developing processes, such that photoresist-free surfaces, which define picture points (active surfaces or pixels) of a display, are formed on the ITO layer structure 2. Each of the photoresist-free surfaces may have a size of about 50×200 µm and is spaced about 100 µm from adjacent photoresist-free surfaces. The photoresist is developed such that no sharp edge is formed. As illustrated in FIG. 2, the photoresist layer structure 3 is patterned such that it slants by about 20 degrees with respect to the ITO layer structure 2. Next, polytetrafluoroethylene (TEFLON®) may be deposited using vapor (gas phase) deposition by supplying $C_3F_8$ gas into a microwave plasma plant. Alternatively, $C_3F_6$ gas, $C_2F_4$ gas, or other similar gases may be used for vapor deposition. The substrate is processed using microwave plasma at a power of 200 W for 60 seconds at an internal chamber pressure of 200 Pa, thereby depositing a 100 nm thick polytetrafluoroethylene (TEFLON®) layer structure 5 on the substrate, as illustrated in FIG. 4, FIG. 9, and FIG. 12.

As an alternative to fluorinated hydrocarbons such as polytetrafluoroethylene (TEFLON®), a polysiloxane compound or polysiloxane may be deposited using hexamethyldisiloxane, acrylic-derived siloxanes, or vinyl-derived siloxanes.

Figure 3:
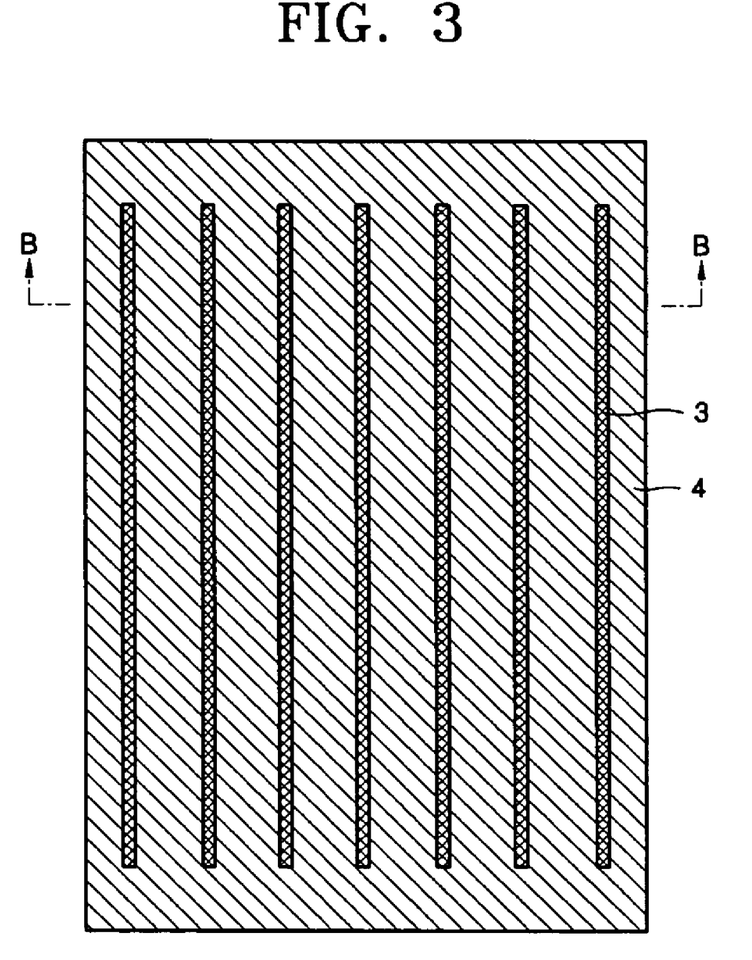
FIG. 3 is a plan view of the base substrate of FIG. 1 on which a shadow mask is arranged.
Figure 4:
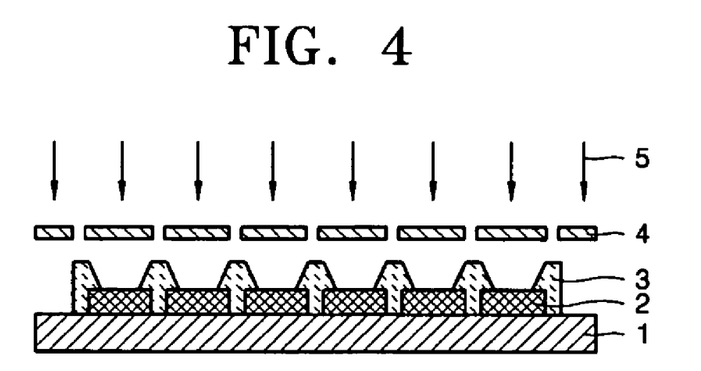
FIG. 4 is a cross-sectional view of the base substrate with the shadow mask arranged thereon taken along line B-B of FIG. 3.
Figure 5:
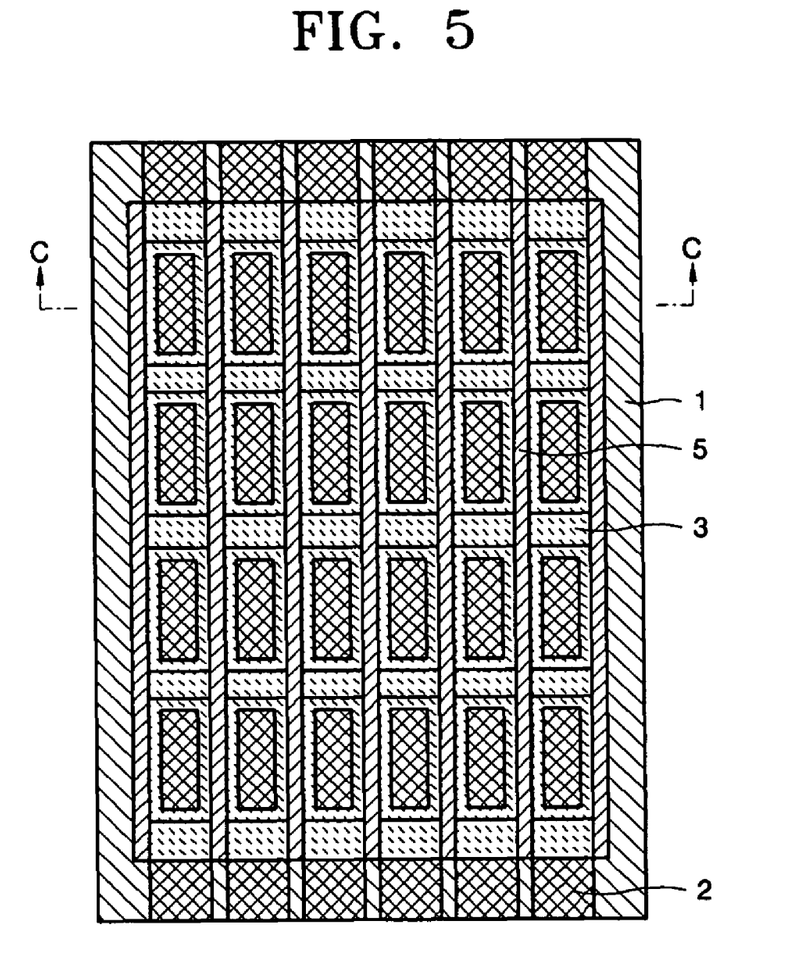
FIG. 5 is a plan view of a base substrate according to another exemplary embodiment of the present invention including an ITO layer structure, a photoresist layer structure, and a polytetrafluoroethylene (TEFLON®) layer.
Figure 6:
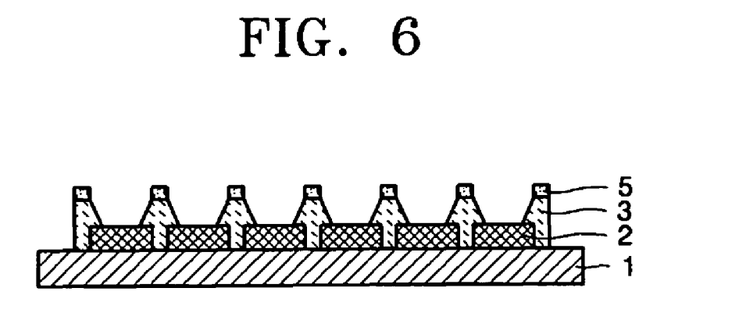
FIG. 6 is a cross-sectional view of the substrate taken along line C-C of FIG. 5.

A shadow mask 4 may be used to form a pattern in the polytetrafluoroethylene (TEFLON®) layer structure 5, as illustrated in FIG. 3 and FIG. 4. The shadow mask 4 may be made from a 500 µm thick metal foil, which is patterned using laser ablation or chemical etching so that the polytetrafluoroethylene (TEFLON®) layer structure 5 is not formed on the ITO layer structure 2. The shadow mask may be placed on the base substrate 1 by means of a suitable device before the deposition of the polytetrafluoroethylene (TEFLON®) layer structure 5. FIG. 5 and FIG. 6 illustrate the substrate according to an exemplary embodiment of the present invention after the polytetrafluoroethylene (TEFLON®) layer structure 5 is formed using the shadow mask 4. As illustrated in FIGS. 5 and 6, the photoresist layer structure 3 may be partially covered with the stripe polytetrafluoroethylene (TEFLON®) layer structure 5 so that an overflow of ink droplets into adjacent pixels may be prevented in an inkjet printing process.

A method of forming the polytetrafluoroethylene (TEFLON®) layer structure 5 using a lift-off process will be described with reference to FIG. 7, FIG. 8, FIG. 9 and FIG. 10.

Figure 7:
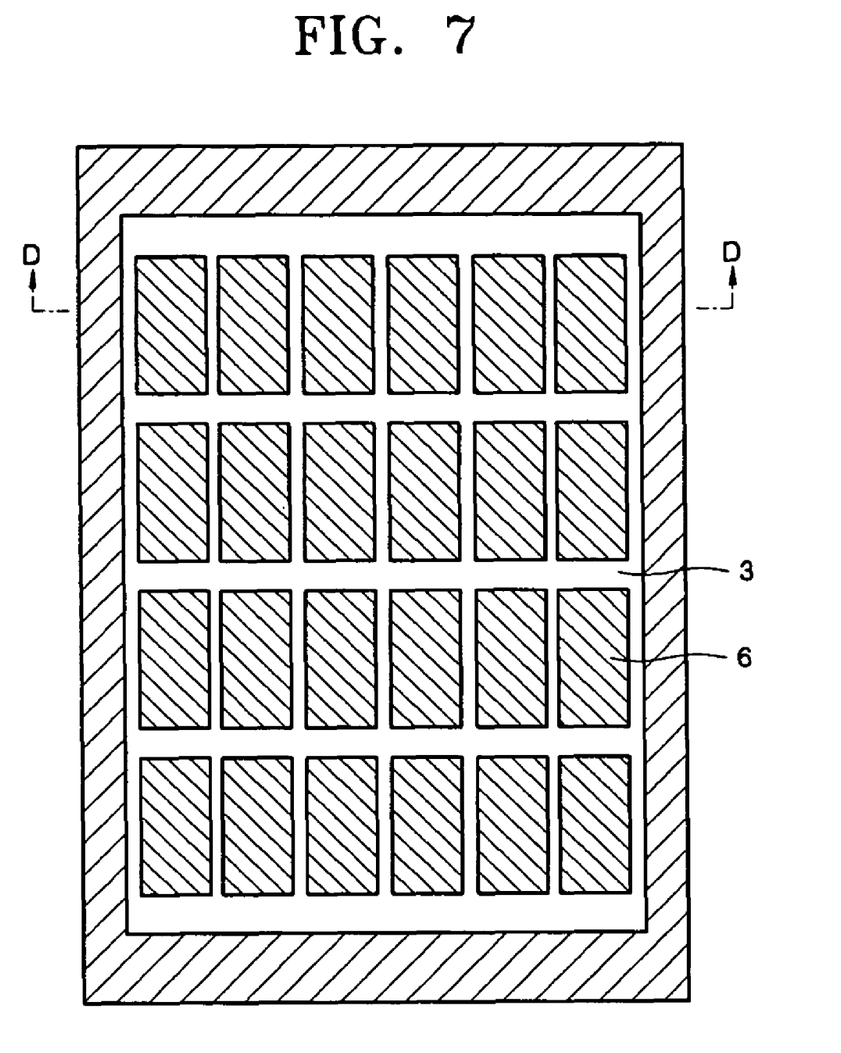
FIG. 7 is a plan view of a base substrate according to another exemplary embodiment of the present invention further including a second photoresist layer structure.
Figure 8:
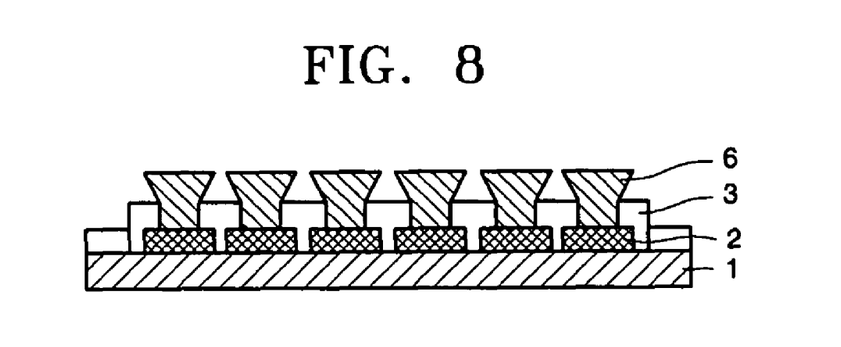
FIG. 8 is a cross-sectional view of the substrate taken along line D-D of FIG. 7.
Figure 11:
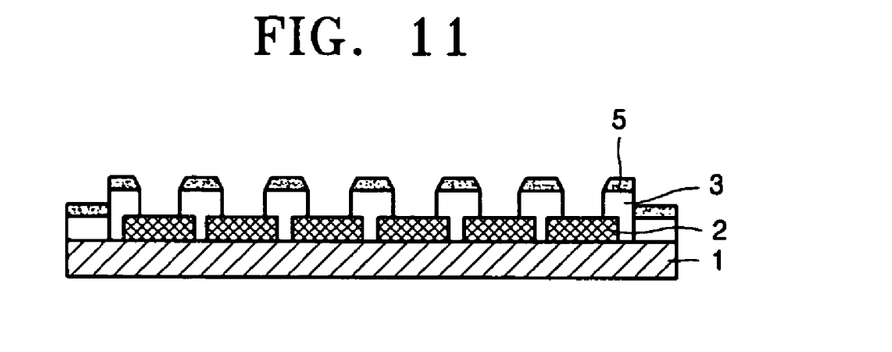
FIG. 11 is a cross-sectional view of a substrate according to an exemplary embodiment of the present invention.

As illustrated in FIGS. 7 and 8, a second photoresist layer structure 6, covering regions where the polytetrafluoroethylene (TEFLON®) layer structure 5 is not formed, may be formed on the substrate of FIG. 1. As is apparent in FIG. 8, the second photoresist layer structure 6 may have overhanging edges. Due to this structure, the discontinuous polytetrafluoroethylene (TEFLON®) layer structure 5 may be formed in a subsequent process using chemical vapor deposition, as illustrated in FIG. 9. The second photoresist layer structure 6, made of a novolak based photoresist, such as photoresist JEM750, may be developed using a solvent, such as tetrahydrofuran, to be removed together with the polytetrafluoroethylene (TEFLON®) layer structure 5 formed thereon, thereby resulting in a substrate according to an exemplary embodiment of the present invention illustrated in FIG. 10 and FIG. 11. The solvent may be supplied into gaps in the second photoresist layer structure 6 after formation of the polytetrafluoroethylene (TEFLON®) layer structure 5. The polytetrafluoroethylene (TEFLON®) layer structure 5, which is discontinuously formed due to the second photoresist layer structure 6 with the overhanging edges, facilitates permeation of the solvent into the substrate structure.

Figure 13:
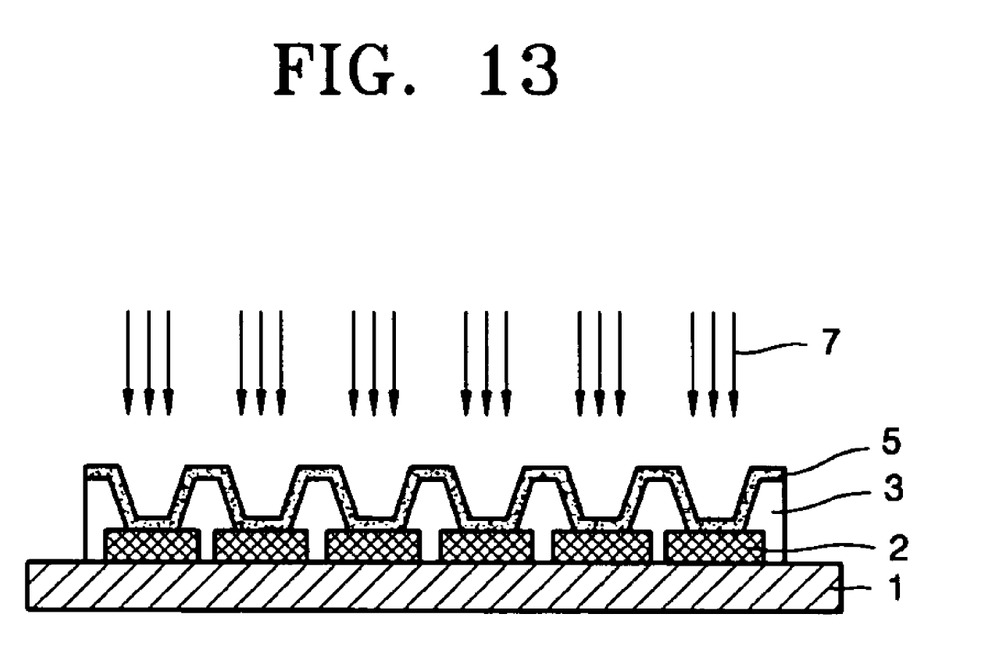
FIG. 13 is a cross-sectional view of the substrate taken along line F-F of FIG. 12 which is irradiated by laser beams to remove the polytetrafluoroethylene (TEFLON®) layer.

Alternatively, the polytetrafluoroethylene (TEFLON®) layer structure 5 may be formed using laser ablation. In this case, after deposition of a continuous polytetrafluoroethylene (TEFLON®) layer on a substrate as illustrated in FIG. 1 (see FIG. 12), predetermined regions of the polytetrafluoroethylene (TEFLON®) layer are irradiated by an eximer laser 7 (KrF-gas) having a wavelength of 248 nm, as illustrated in FIG. 13, to remove the polytetrafluoroethylene (TEFLON®) layer from the irradiated regions without effecting the underlying layer.

As described above, a substrate suitable for inkjet printing according to exemplary embodiments of the present invention may be manufactured by forming the ITO layer structure 2, the photoresist layer structure 3, and the polytetrafluoroethylene (TEFLON®) layer structure 5 on the basic substrate 1. After forming the polytetrafluoroethylene (TEFLON®) layer structure 5 using the shadow mask 4 and the second photoresist layer structure 6 by a lift-off process or laser ablation, a hole transport layer and/or a light emissive layer are coated on the active area, i.e., the ITO layer structure 2. The hole transport layer may be made from polyethylenedioxythiophene-polystyrene sulfone acid. The light emissive layer may be made from polyphenylene vinylene or polyfluorene.

The substrate according to exemplary embodiments of the present invention may be used for passive and active matrix type organic electroluminescence displays having underlying TFT layers. A DNA sensor or a color filter may also be deposited on a substrate according to exemplary embodiments of the present invention As described above, a substrate according to an exemplary embodiment of the present invention is made of organic material and has a large surface tension variation and a small thickness variation. A discontinuous layer structure (pattern) made of fluorinated hydrocarbon or polysiloxane (polysiloxane compounds) is arranged on a discontinuous photoresist layer structure (pattern) formed on the surface of a base substrate. Polytetrafluoroethylene (TEFLON®) may be used as the fluorinated hydrocarbon. The substrate according to an exemplary embodiment of the present invention, therefore, may be comprised of a base substrate made of glass, a synthetic material, or silicon, and two-layered structures arranged on the base substrate. A photoresist layer structure, as one of the layered structures on the base substrate, defines an exposed surface region that may, as an example, correspond to an indium tin oxide anode of the OLED. In this case, the exposed surface region refers to an active region on the base substrate that is not covered by the photoresist layer structure. The photoresist layer structure also protects underlying electrical circuits, such as thin film transistors. The second of the two layered structures may be made of fluorinated hydrocarbon or polysiloxane, and it has a lower surface tension than the photoresist layer structure. In this layer structure, only a boundary region of the active region consists of fluorinated hydrocarbon or polysiloxane. Due to the lower surface tension of the region surrounding the active region, an overflow of ink droplets discharged according to an inkjet printing method may be prevented. The ink may be a solution containing, for example, polymers used in an OLED display. However, the substrate according to an exemplary embodiment of the present invention may be used, but is not limited to, when manufacturing an OLED display using an inkjet printing process. A DNA sensor or a color filter may also be deposited on a substrate according to exemplary embodiments of the present invention using an inkjet printing process.

The layer structure consisting of fluorinated hydrocarbon or polysiloxane may fully or partially cover the underlying photoresist layer structure, and it may prevent an overflow of ink droplets when properly positioned between two neighboring active regions (pixels).

The substrate according to an exemplary embodiment of the present invention described above, which includes the base substrate, the photoresist layer structure, and the fluorinated hydrocarbon or polysiloxane layer structure, has intrinsic surface tension variation. For example, the photoresist layer structure and an active surface made of indium-tin-oxide have a surface tension ranging from about 50 mN/m to about 100 mN/m. The layer structure consisting of fluorinated hydrocarbon or polysiloxane has a surface tension ranging from about 10 mN/m to about 40 mN/m. Consequently, surface tension variation between the photoresist layer structure and the discontinuous organic layer structure ranges from about 10 mN/m to about 90 mN/m. Therefore, sufficient surface variation may be achieved without performing an additional process such as using plasma.

Another advantage of the present invention is that a surface treatment technique used in the manufacture of OLEDs, for example, an UV-ozone treatment for cleaning an indium tin oxide (ITO) layer, may be applied to the substrate without adversely affecting its surface tension variation.

In an exemplary embodiment of the present invention, an oxygen plasma treatment may be performed to selectively increase the surface tension of the active (pixel) region, for example, the ITO layer, without increasing the surface tension of the blocking layer, thereby resulting in a greater surface tension variation in the substrate. The blocking layer refers to the discontinuous organic layer composed of fluorinated hydrocarbon or polysiloxane.

In a method of manufacturing a substrate for use in inkjet printing according to an exemplary embodiment of the present invention, at least one photoresist layer structure is deposited on a base substrate. Next, a discontinuous layer of fluorinated hydrocarbon or polysiloxane is formed thereon. Suitable photoresists include any commercially available photoresists, such as novolak, an acrylic lacquer, an epoxy lacquer, a polyimide lacquer, and other like substances. The photoresist layer may be deposited using a standard technique, such as lacquer-deposition and exposure and developing processes.

The blocking layer composed of fluorinated hydrocarbon or polysiloxane may be deposited, for example, using $C_3F_8$ by means of chemical vapor deposition or using polytetrafluoro ethylene by means of thermal deposition.

The blocking layer deposited as described above may be patterned using a shadow mask by means of laser ablation or a lift-off process.

Another advantage of the substrate according to an exemplary embodiment of the present invention is that the thickness variation is suitable for defining active regions having surface tensions of 30 mN/m and 70 mN/m, respectively, using an organic or aqueous solution or suspension by means of inkjet printing. The blocking layer, which is the layer having a lower surface tension and may be formed of polytetrafluoroethylene (TEFLON®), cannot be coated with both solutions, whereas the ITO or photoresist layer having a higher surface tension may be coated with the solutions, thereby resulting in a partially coated, geometrical layer that may prevent ink droplet overflow.

Another advantage of the substrate according to an exemplary embodiment of the present invention is that the blocking layer, which may be a polytetrafluoroethylene (TEFLON®) layer, may effectively expel ink droplets at a considerably small thickness, for example, 100 nm or less. This thin blocking layer also results in a minor shadow effect on a metal layer, such as a subsequently formed OLED cathode layer. Edges of the substrate may be fully covered by forming the metal layer to be considerably thicker than the blocking layer structure and the photoresist layer structure. Consequently, the formation of an uneven metal layer in edge or "bank" regions and an increase in electrical resistance of the uneven metal layer, such as with a conventional substrate, may be prevented, thereby reducing an input power of an active matrix type OLED and ensuring high operational stability.

Another advantage of the substrate according to an exemplary embodiment of the present invention is that the blocking layer, which may be a polytetrafluoroethylene (TEFLON®) layer, may be 5 μm or less wide. Consequently, the gap between two adjacent pixels may be reduced as compared to a conventional structure with banks having widths greater than 10 μm, which may permit implementation of a higher resolution large-screen display on the substrate. Additionally, the smaller widths may permit a top-emission type display to have a larger aspect ratio, which is the ratio of a light emission area to the entire pixel area.

Also, the active regions defined by inkjet printing may have more uniform thicknesses. Thickness uniformity of layers having surface tension variations is affected by a drying phenomenon at the boundary region of the layers. Furthermore, because the blocking layer has a small width, a larger clearance of the blocking layer to the active surface (i.e., ITO) does not deteriorate screen resolution.

Finally, the above-described layers may be deposited and patterned using only organic materials and uncomplicated techniques. For example, complex equipment, such as a sputter plant or a plasma etching apparatus, is not required, which reduces manufacturing costs.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A substrate for inkjet printing, comprising:
    a base substrate;
    a discontinuous photoresist layer structure formed on a surface of the base substrate; and
    a discontinuous organic layer structure formed on a portion of the photoresist layer structure,
    wherein the discontinuous organic layer structure has a lower surface tension with respect to an inkjet printing solution than the discontinuous photoresist layer structure.

2. The substrate of claim 1, wherein the discontinuous organic layer structure covers the photoresist layer structure.

3. The substrate of claim 1, wherein a surface tension variation between the discontinuous photoresist layer structure and the discontinuous organic layer structure ranges from about 10 mN/m to about 90 mN/m.

4. The substrate of claim 3, wherein the discontinuous photoresist layer structure has a surface tension ranging from about 50 mN/m to about 100 mN/m.

5. The substrate of claim 3, wherein the discontinuous organic layer structure has a surface tension ranging from about 10 mN/m to about 40 mN/m.

6. The substrate of claim 1, further comprising an intermediate layer formed on the base substrate.

7. The substrate of claim 6, wherein the intermediate layer is made of indium tin oxide.

8. The substrate of claim 6, wherein the intermediate layer has a surface tension ranging from about 50 mN/m to about 100 mN/m.

9. A substrate for inkjet printing, comprising:
a base substrate;
an intermediate layer made of indium tin oxide and formed on the base substrate;
a discontinuous photoresist layer structure formed on a portion of the base substrate and a portion of the intermediate layer; and
a discontinuous organic layer structure formed on a portion of the photoresist layer structure,
wherein the discontinuous organic layer structure has a lower surface tension with respect to an inkjet printing solution than the discontinuous photoresist layer structure, and
wherein the discontinuous organic layer structure is made of a fluorinated hydrocarbon or polysiloxane.

10. The substrate of claim 9, wherein the fluorinated hydrocarbon is polytetrafluoro ethylene.

11. The substrate 9, wherein the base substrate is made of at least one of glass, silicon, or a synthetic material.

12. The substrate of claim 9, wherein the discontinuous photoresist layer structure is made of at least one of novolak, an acrylic lacquer, an epoxy lacquer, or a polyimide lacquer.

13. The substrate of claim 9, wherein a surface of the discontinuous photoresist layer structure, on which the discontinuous organic layer structure is not formed, contacts the substrate to define an active surface of the substrate.

14. The substrate of claim 13, wherein the active surface of the substrate has a size of about 50 μm by 200 μm and is spaced about 100 μm from an adjacent active surface.

15. An electroluminescence display device, comprising:
a base substrate;
a discontinuous photoresist layer structure formed on a surface of the base substrate; and
a discontinuous organic layer structure formed on a portion of the photoresist layer structure,
wherein the discontinuous organic layer structure has a lower surface tension with respect to an inkjet printing solution than the discontinuous photoresist layer structure.

16. The substrate of claim 1, wherein the discontinuous organic layer structure is made of a polysiloxane.

* * * * *